US011042439B1

(12) United States Patent
Sridhara et al.

(10) Patent No.: US 11,042,439 B1
(45) Date of Patent: Jun. 22, 2021

(54) EFFICIENT READ AND RECOVERY WITH OUTER CODE

(71) Applicant: Seagate Technology LLC, Cupertino, CA (US)

(72) Inventors: Deepak Sridhara, Longmont, CO (US); Ara Patapoutian, Hopkinton, MA (US); Prafulla B Reddy, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 262 days.

(21) Appl. No.: 15/345,440

(22) Filed: Nov. 7, 2016

(51) Int. Cl.
*G06F 11/00* (2006.01)
*G06F 11/10* (2006.01)
*H03M 13/29* (2006.01)
*H03M 13/11* (2006.01)
*H03M 13/15* (2006.01)
*H03M 13/37* (2006.01)

(52) U.S. Cl.
CPC ..... *G06F 11/1076* (2013.01); *H03M 13/1102* (2013.01); *H03M 13/1515* (2013.01); *H03M 13/2906* (2013.01); *H03M 13/3746* (2013.01)

(58) Field of Classification Search
CPC .......... G06F 11/1076; H03M 13/1102; H03M 13/15; H03M 13/151; H03M 13/1515; H03M 13/2906; H03M 13/2957; H04L 1/0057; G11B 20/1833
USPC ................................ 714/752, 755, 781, 784
See application file for complete search history.

(56) References Cited

U.S. PATENT DOCUMENTS

| | | | |
|---|---|---|---|
| 6,470,461 B1 * | 10/2002 | Pinvidic | G11B 20/1883 714/6.13 |
| 8,570,679 B2 | 10/2013 | Wu et al. | |
| 8,572,457 B2 * | 10/2013 | Rub | G06F 11/1012 714/755 |
| 8,760,986 B2 | 6/2014 | Reddy et al. | |
| 8,832,524 B2 * | 9/2014 | Bennett | H03M 13/2906 714/755 |
| 8,910,026 B2 * | 12/2014 | Patapoutian | H03M 13/3746 714/779 |
| 8,943,390 B1 * | 1/2015 | Tang | H03M 13/2707 714/776 |
| 8,976,476 B1 | 3/2015 | Lu et al. | |
| 9,396,062 B1 * | 7/2016 | Sridhara | G06F 11/1068 |
| 9,489,254 B1 * | 11/2016 | Franklin | H03M 13/373 |
| 2005/0268203 A1 * | 12/2005 | Keays | G06F 11/10 714/758 |
| 2010/0330920 A1 * | 12/2010 | Koskela | H04L 1/1854 455/67.11 |

(Continued)

*Primary Examiner* — Albert Decady
*Assistant Examiner* — Osman M Alshack
(74) *Attorney, Agent, or Firm* — Kirk A. Cesari

(57) ABSTRACT

An apparatus may include a circuit configured to initialize a read operation to read one or more requested data segments of a respective data unit having a plurality of data segments. Based on a number of failed data segments of the requested data segments and an erasure capability of an outer code error correction scheme, the circuit may perform erasure recovery to recover the failed data segments. Based on the number of failed data segments, the erasure capability of the outer code error correction scheme, and a threshold value, the circuit may perform iterative outer code recovery to recover the failed data segments.

18 Claims, 13 Drawing Sheets

(56) References Cited

U.S. PATENT DOCUMENTS

| | | | | |
|---|---|---|---|---|
| 2011/0302473 | A1* | 12/2011 | Zhou | H04L 1/008 714/755 |
| 2012/0278679 | A1* | 11/2012 | Rub | H03M 13/3746 714/755 |
| 2013/0275829 | A1 | 10/2013 | Sridhara | |
| 2014/0136917 | A1* | 5/2014 | Patapoutian | G11B 20/10527 714/752 |
| 2014/0136930 | A1* | 5/2014 | Patapoutian | H03M 13/1111 714/779 |
| 2014/0172934 | A1 | 6/2014 | Yang et al. | |

* cited by examiner

EFFICIENT READ AND RECOVERY WITH OUTER CODE

SUMMARY

An apparatus may include a circuit configured to initialize a read operation to read one or more requested data segments of a respective data unit having a plurality of data segments. Based on a number of failed data segments of the requested data segments and an erasure capability of an outer code error correction scheme, the circuit may perform erasure recovery to recover the failed data segments. Based on the number of failed data segments, the erasure capability of the outer code error correction scheme, and a threshold value, the circuit may perform iterative outer code recovery to recover the failed data segments.

An apparatus may include a circuit configured to initialize a read operation to read one or more requested data segments of a respective data unit, a first number of requested data segments being less than a second number of data segments included in an outer code block of the respective data unit having a plurality of data segments. The circuit may determine, at least in part based on a number of failed data segments, to extend the read operation to include each data segments of outer code block. Further, subsequent to the read operation reaching an end of the outer code block, the circuit may perform recovery of the failed data segments based at least in part on an outer code error correction scheme of the outer code block.

A method of recovering data on a storage medium may initialize a read operation to read one or more requested data segments of a respective data unit having a plurality of data segments. Based on a number of failed data segments of the requested data segments and an erasure capability of an outer code error correction scheme, the method may include performing erasure recovery to recover the failed data segments. Further, based on the number of failed data segments, the erasure capability of the outer code error correction scheme, and a threshold value, the method may include performing iterative outer code recovery to recover the failed data segments.

These and other features and benefits that characterize various embodiments of the disclosure can be understood in view of and upon reading the following detailed description and review of the associated drawings.

DETAILED DESCRIPTION

Figure 1:
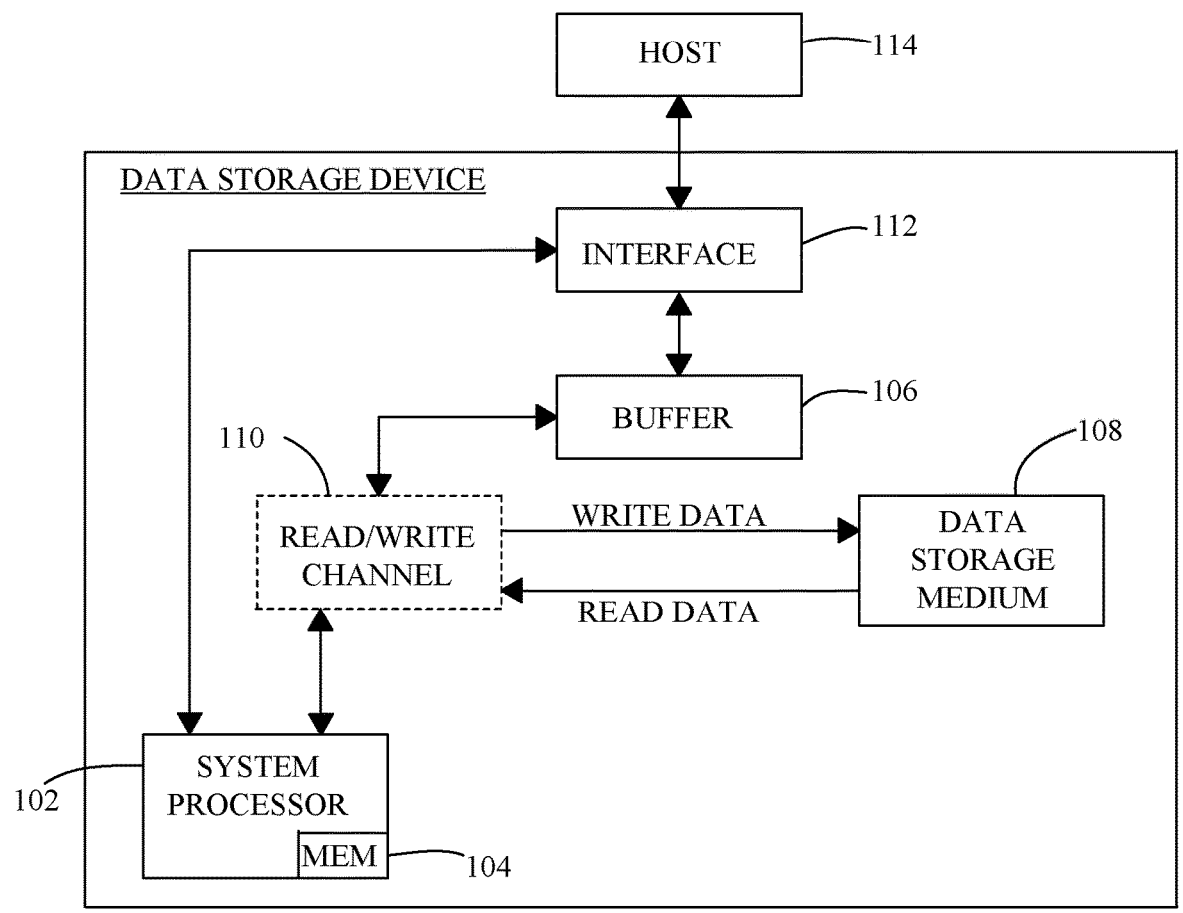
FIG. 1 is a simplified block diagram of an exemplary data storage device, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

Embodiments of the disclosure may provide a method and apparatus for recovering data on a storage medium. When data is requested by a host from a storage device such as a hard drive, the requested data (e.g., incoming or read data) may be checked to ensure that it is error free. For example, a syndrome, such as an outer code syndrome, may be generated for a portion of requested data to indicate whether it contains errors. Requested data that contains errors (in other words, the requested data is not error free) may result in what may be referred to as a data failure (e.g., a segment/sector failure, a unit/track failure, etc.). Such requested failed data may then be decoded using various decoding techniques and/or the requested failed data may be attempted to be re-read from the storage medium. Some embodiments herein relate to opportunistically utilizing various decoding or recovery processes to recover failed data and to managing such failed data in a buffer (e.g., a buffer holding quarantined data to be decoded).

For example, the systems and methods described herein may utilize the status of the read, such as side information related to the failed data, to choose between recovery methods, which may include inner code recovery (e.g. using LDPC (low density parity check) codes), outer code recovery (e.g. using Reed Solomon (RS) code words and parity checks on a per symbol basis), erasure recovery (using RS correction on a per data segment basis), iteratively using inner and outer codes to recover data (hereinafter iterative outer code (or IOC) recovery), deferred decoding, and other recovery methods and/or to choose the failed data segments to maintain in a buffer for deferred decoding (e.g., a deferred decoding buffer of specified size). The example systems and methods described herein may also relate to protocols which may perform these operations.

In some examples, a system with deferred decoding buffer of a specified size, may make a decision on whether to store the samples of a failed read in the buffer and/or to discard the samples of a current failed data segment or previously stored samples of another failed data segment, so that the failed data segment maybe recovered at a later stage. Some example embodiments may make a decision to extend a read of a subset of data segments of a data unit to the full outer code block (e.g. the full data unit or track) so that the outer code may be used. In addition, some embodiments may decide to continue reading until the end of the read/outer code block without halting irrespective of the number of failed data segments.

When a read completes (either of the entire OC block or of the subset if no decision was made to extend the read to read the full OC block or data unit), deferred decoding may be performed. When the full outer code block was read and the number of failed data segments after deferred decoding is not greater than an erasure correcting capability of the outer code, erasure recovery (described in more detail below) may be performed. When the full outer code block was read and the number of failed data segments after deferred decoding is greater than the erasure correcting capability of the outer code but not greater than the erasure correcting capability of the outer code plus a threshold, iterative outer code recovery may be performed. In other cases, error recovery methods may be employed on the failed data segments to attempt to reduce the number of failed data segments to a smaller number, for example, where IOC or erasure recoveries may be invoked.

A code may include rules for converting a piece of information into another representation (e.g., one symbol into another symbol). A code word may be an element of a code. Each code word may include a sequence of assembled symbols that may correspond with the rules of the code. For example, codes may be used in the error-correction of data. These types of codes, often described as channel codes, may contain redundancy that may provide for the communication of more reliable data, for example, in the presence of noise.

One example error-correcting code is a concatenated code. Concatenated codes may be derived by using an inner code and an outer code.

Outer codes may improve the tolerance to defects, for example, by allowing one or more inner code failures. The size of a defect that can be corrected may be closely related to the code overhead (e.g., the outer code). Therefore, an outer code or longer code word may achieve the desired defect coverage with less relative overhead. Having an outer code that can recover inner code failures may also allow the inner code to be optimized for random error performance. LDPC (low density parity check) codes (which may generally be included in an inner code) may trade off performance to lower the error floor below the unrecoverable error rate. With an outer code as a safety mechanism, the error floor may be relaxed and LDPC codes may be optimized for performance.

Outer codes may be implemented by x-or'ing data across all inner code words. Such an implementation may provide the capability to recover from a single inner code word failure. In some such implementations, the signal-to-noise (SNR) gain for the overhead expended may be relatively small. In some implementation, outer codes may be derived based on Reed-Solomon codes. Such codes may allow for multiple inner code failures and may offer a significant SNR benefit for random errors. Furthermore, outer codes may "average out" the SNR variability. In sequential writing, many sources of variability may be removed. For example, degraded signals due to adjacent track interference (ATI) or adjacent track erasure (ATE) may be greatly diminished because repeated writes to adjacent or neighboring tracks may be eliminated. However, variability in regards to SNR, primarily due to transducer positioning, may occur. Outer codes (or very long code words) may exceed the time constants of the SNR variability and may offer the "averaged out" SNR variability.

FIG. 1 is a simplified block diagram of an exemplary data storage device 100 that can be used in embodiments described herein. Data storage device 100 includes a system processor 102, which is used for controlling certain operations of data storage device 100. The various operations of data storage device 100 are controlled by system processor 102 with the use of programming stored in memory 104. System processor 102 may be coupled to a buffer 106 through an optional read/write channel 110. Buffer 106 can temporarily store user data during read and write operations and may include the capability of temporarily storing access operations pending execution by system processor 102.

System processor 102 may execute read and write operations on data storage medium 108. In one embodiment, system processor 102 may also be used for carrying out data recovery from data storage medium 108. In some embodiments, data storage medium 108 may be one or more magnetic discs. In other embodiments, data storage medium 108 can be a collection of solid-state memory elements. These read/write operations executed by system processor 102 may be performed directly on data storage medium 108 or through optional read/write channel 110. Read/write channel 110 may receive data from system processor 102 during a write operation, and may provide encoded write data to data storage medium 108. During a read operation, read/write channel 110 may process a read signal in order to detect and may decode data recorded on data storage medium. The decoded data may be provided to system processor 102 and ultimately through an interface 112 to an external host 114.

External host 114 may be a processor in an electronic device, such as a processor in a computing device. Although FIG. 1 illustrates external host 114 as being a single host, data storage device 100 may be connected through interface 112 to multiple hosts. Through interface 112, data storage device 100 may receive data and commands from external host 114 and may provide data and error codes to external host 114 based on commands executed by system processor 102.

Data storage medium 108 may include a plurality of data units. Each data unit may be subdivided into a plurality of storage segments. As defined herein, a storage segment may be the basic unit of data storage on data storage medium 108. The storage segments may be identified and located at various positions on medium 116.

Figure 2:
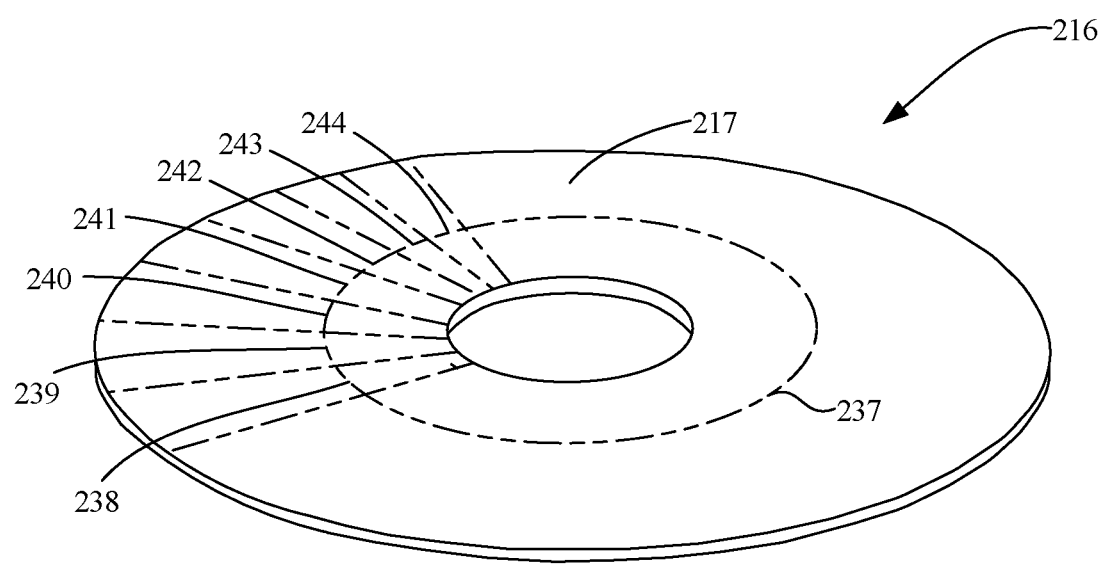
FIG. 2 illustrates an exemplary perspective view of a storage medium, in accordance with certain embodiments of the present disclosure.

As previously discussed, data storage medium 108 may include one or more magnetic discs. FIG. 2 illustrates such an exemplary disc storage medium 216. In FIG. 2, storage medium 216 may include a surface 217 having a plurality of substantially concentric circular tracks (e.g., data units), such as data track 237. In some embodiments, the data tracks on storage medium 216 may be logically divided into a plurality of data storage sectors (e.g., storage segments). Each storage sector may be identified and located at various positions on disc 216. In the disc-type medium example illustrated in FIG. 2, storage segments or data sectors may be "pie-shaped" angular sections of a track that are bounded on two sides by radii of the disc and on the other side by the perimeter of a circle that nay define the track. For example, data track 237 may be logically divided into data sectors 238-244.

Each track or data unit may have a related logical block addressing (LBA). For disc-type storage media, the LBA may include a cylinder address, head address and sector address. A cylinder may identify a set of specific tracks on the disc surface of each disc 116 which may lie at equal radii and may generally be simultaneously accessible by a collection of transducing heads in a data storage device. The head address may identify which head can read the data and therefore may identify which disc from the plurality of discs 216 the data is located on. As mentioned above, each track within a cylinder may be further divided into sectors for storing data. The data sector may be identified by an associated sector address.

With reference back to FIG. 1 and in embodiments described in more detail below, system processor 102 may implement a two-level parity encoding system to detect and correct data errors. These embodiments may organize data into two sets of groupings in which the first set of grouping may be encoded by an inner code and the second set of grouping may be encoded by an outer code.

Figure 3:
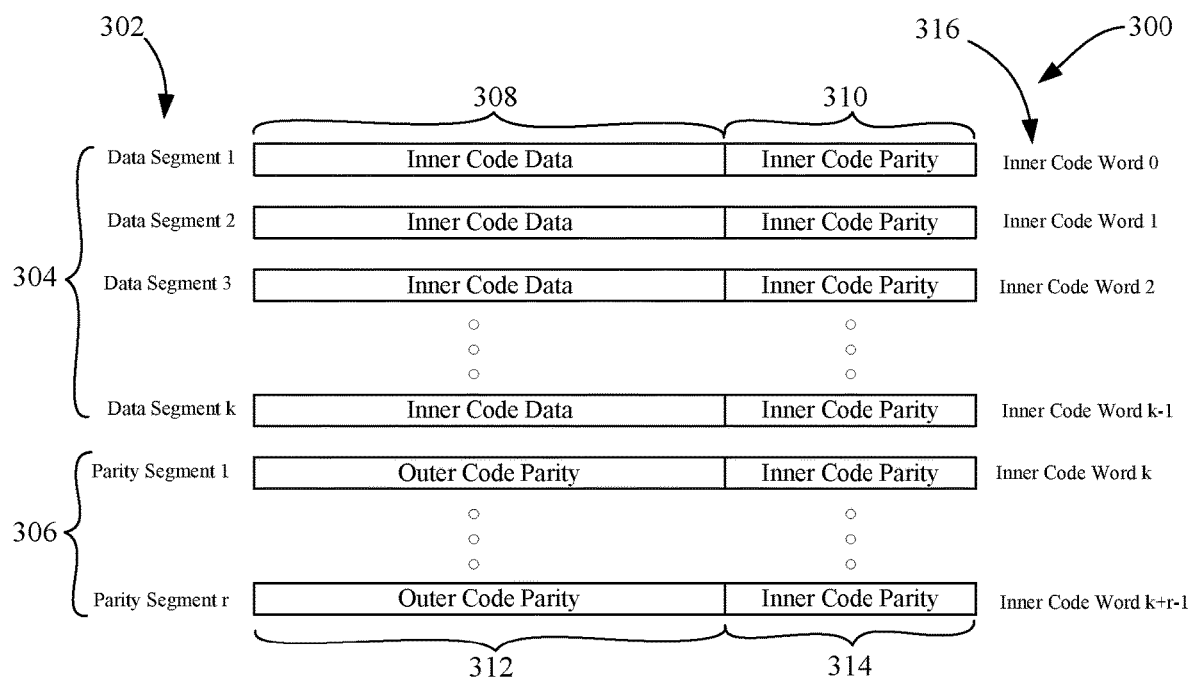
FIG. 3 illustrates a diagrammatic view of a data unit and its organized groupings of data into inner and outer codes, in accordance with certain embodiments of the present disclosure.

FIG. 3 illustrates a diagrammatic view of an embodiment of a data unit 300 and the organization of groupings of data into inner and outer codes. Data unit 300 may include a plurality of segments 302 for storing user data and/or parity data. The rows in FIG. 3 may represent a segment 302 in data unit 300 and may also represent one grouping in the first set of groupings being encoded by an inner code.

Segments 302 may be further divided into k number of segments 304 and r number of segments 306, wherein k and r may be integers greater than or equal to 1. Each of the k number of segments 304 may include a first portion 308, which may contain user data encoded by the inner code. Each of the k number of segments 304 may also include a second portion 310, which may contain inner code parity data encoded by an inner code. This inner code parity 310 may provide inner code protection against errors in the segment to which it belongs. More specifically, inner code parity 310 may provide protection against errors in the inner code data 308. Recovery using inner code parity may be referred to inner code recovery herein.

Each of the r number of segments 306 may include a first portion 312, which may contain parity data encoded by the outer code. Each of the r number of segments 306 may also include a second portion 314, which may contain inner code parity data encoded by the inner code. The outer code parity 312 may provide outer code protection against inner code failures, while the inner code parity 314 of r number of segments 306 may provide inner code protection against errors in the segment to which it belongs. More specifically, the inner code parity 314 may provide protection against errors in the outer code parity 312. Therefore, each row of segments may be considered to be an inner code word 316 starting with inner code word 0 and ending with inner code word k+r−1. Recovery of segments 306 using outer code may be referred to herein as outer code recovery.

Any number of segments 306 (as represented by rows) may be provided for the outer code. The more segments that are provided for the outer code, the more errors that may be detected and may be corrected by the outer code parity 312. However, increasing the number of segments for the outer code and thereby increasing the number of parity data symbols, may come at the cost of reduced storage capacity of user data. As illustrated in FIG. 3 and for example, if the k number of segments is equal to 20 and the r number of segments is equal to 10, the outer code parity 312 may be capable of correcting a total of 10 errors in the 30 total segments which could be affected. It should be realized that errors may occur both in segments 304 as well as in segments 306.

In some embodiments, each of the plurality of segments 302 may be indicated by a row in FIG. 3 is associated with a logical block address (LBA). Each LBA may designate an address for the row of inner code data and inner code parity on a storage medium. In embodiments in which a magnetic disc provides the storage medium, the LBA can be the LBA of a data sector of a data track on the storage medium.

Figure 4:
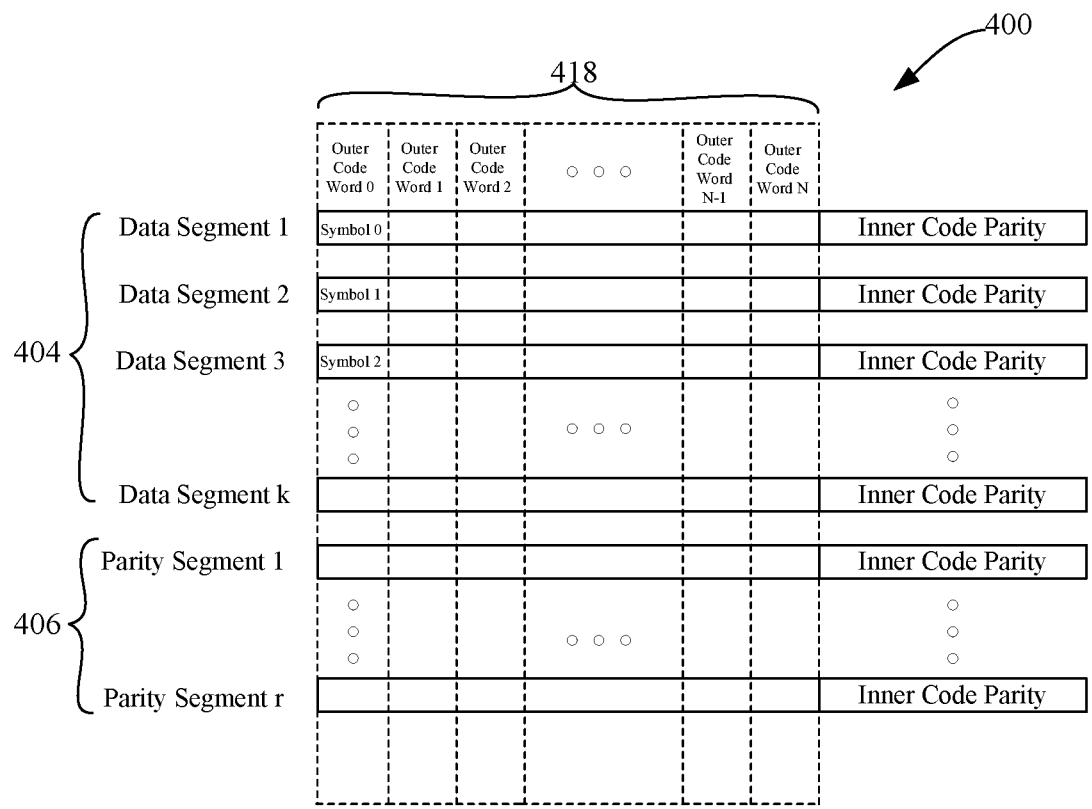
FIG. 4 illustrates a diagrammatic view of a data unit and its organized groupings of data into inner and outer codes based on a Reed-Solomon scheme, in accordance with certain embodiments of the present disclosure.

FIG. 4 illustrates a diagrammatic view of an embodiment of a data unit 400 and the organization of groupings of data into inner and outer codes based on a Reed-Solomon (RS) scheme. With a RS outer code, the unit of correction may be a symbol. A symbol may contain multiple bits of data. More specifically, the r number of segments 406 may be associated with the k number of segments 404 to derive a plurality of symbol-based outer code words 418. Each outer code word 418 may contain m number of symbols from each segment for correcting m number of symbols in each outer code word 418, wherein m is an integer greater than or equal to 1. For purposes of simplification, FIG. 4 may illustrate Reed-Solomon outer code words 418 having one symbol per segment (e.g., m=1).

Using the RS outer code illustrated in FIG. 4, it may be possible, in some instances, for more than the r number of inner code failures to be corrected. Even if inner code words are not recoverable, most of the bits of the inner code words may be correct. Similarly, symbols in outer code words that may be contained in failing inner code words may be mostly error-free and many outer code words can be corrected. More specifically, an outer code having r number of segments 406 can correct r number of inner code failures using erasures, where an erasure may be referred to as knowing the location of a symbol. However, the outer code can correct many outer code words 418 without using erasures. In addition, the outer code may also correct a combination of known erasures and unknown errors in an outer codeword during IOC recovery.

Figure 5:
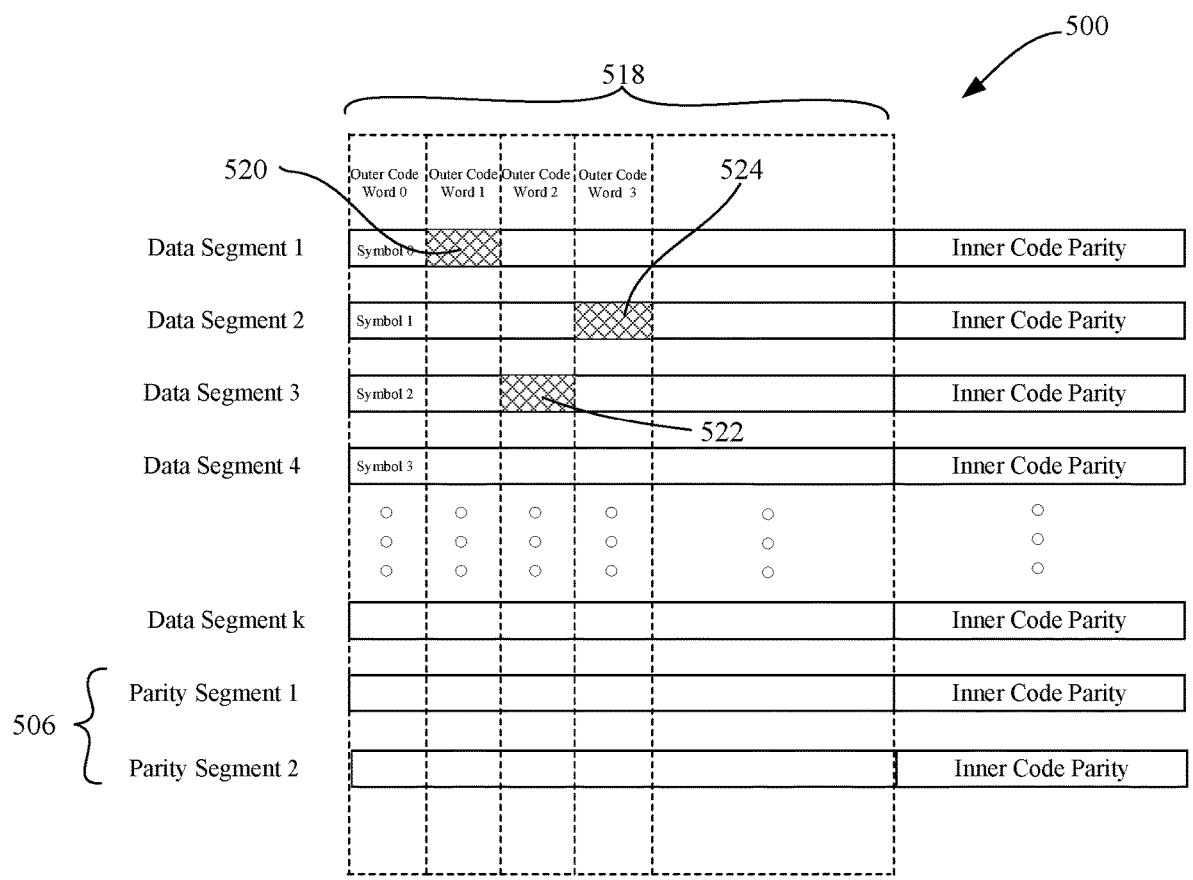
FIG. 5 illustrates a diagrammatic view of a data unit and its organized groupings of data into inner and outer codes based on a Reed-Solomon scheme, in accordance with certain embodiments of the present disclosure.

FIG. 5 illustrates a diagrammatic view of one embodiment of a data unit 500 and the organization of groupings of data into inner and outer codes based on a RS scheme. In FIG. 5, the r number of segments 506 is two (e.g., r=2). For simplicity and as illustrated in FIG. 4, each outer code word 518 may contain one symbol per segment (e.g., m=1). In addition, data unit 500 may include three symbol errors 520, 522 and 524 as illustrated in cross-hatch. These three symbol errors may be representative of errors that exceed the correction capability of the inner code.

Because data unit 500 includes three inner code failures and data unit 500 includes two parity segments, the RS outer code may not be sufficient to correct the three inner code failures using erasures. However, each outer code can correct one symbol in error in an outer code word 518 without erasures, and therefore the three errors shown can be corrected and the corresponding three inner code words can be recovered. It should be realized though that with higher bit error rates, the probability of having two or more symbol errors in the same outer code word in the configuration illustrated in FIG. 5 may be significant and may limit this functionality.

Figure 6:
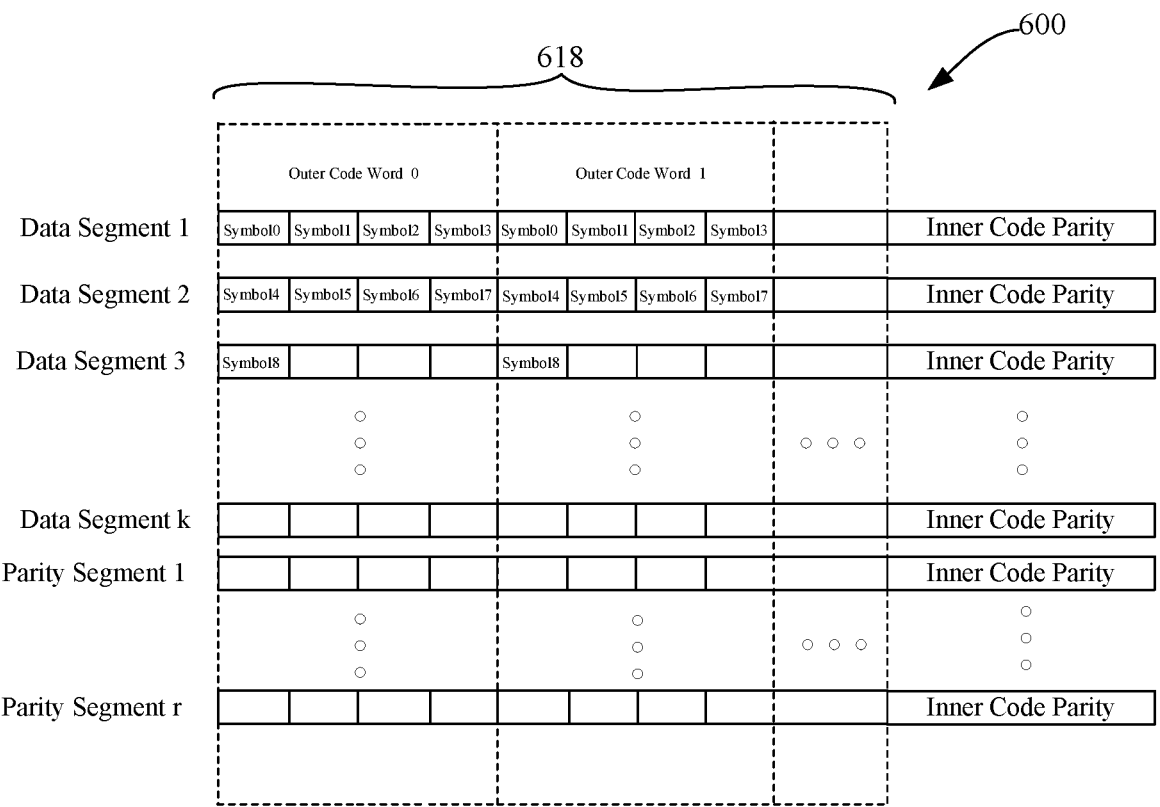
FIG. 6 illustrates a diagrammatic view of a data unit and its organized groupings of data into inner and outer codes based on a Reed-Solomon scheme, in accordance with certain embodiments of the present disclosure.

FIG. 6 illustrates a diagrammatic view of one embodiment of a data unit 600 and the organization of groups of data into inner and outer codes based on a RS scheme. As illustrated in FIG. 6, longer outer code words 618 may be used compared to the length of outer code words in FIG. 5. These longer outer code words 618 contain four symbols in each inner code word (e.g., m=4). In a system without erasures, more errors may be corrected using a longer outer code word than that of a short outer code word.

Figure 7:
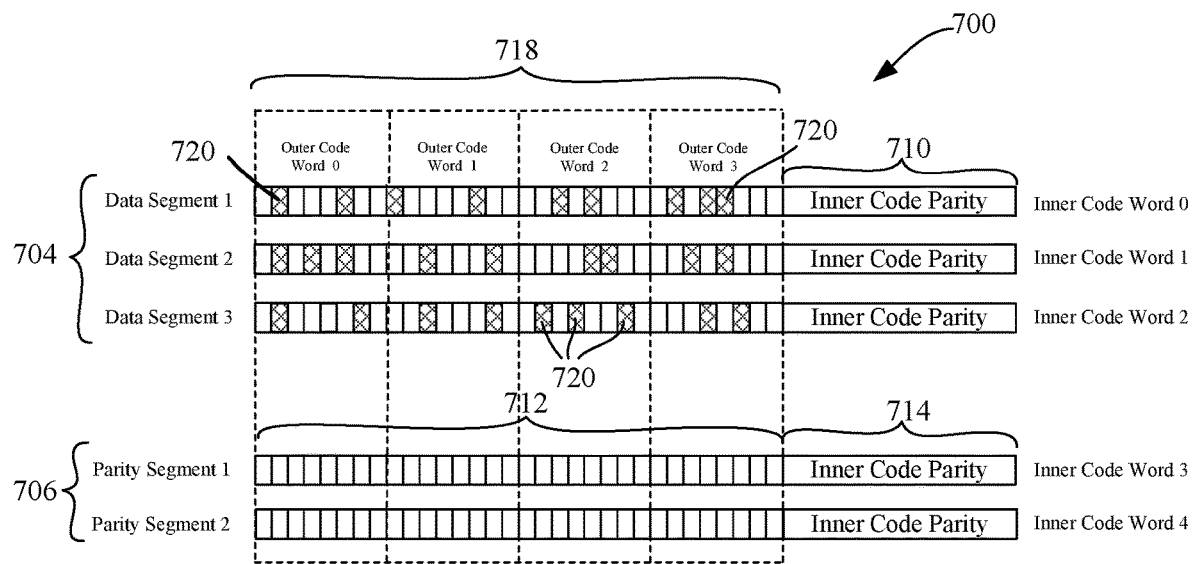
FIG. 7 illustrates a diagrammatic view of a data unit and its organized groupings of data into inner and outer codes based on a Reed-Solomon scheme, in accordance with certain embodiments of the present disclosure.

FIG. 7 illustrates a diagrammatic view of one embodiment of a data unit 700 and the organization of groups of data into inner code 710 and 714 and outer code 712 based on a RS scheme. In FIG. 7, each outer code word 718 may include longer outer code words. In particular, each outer code word 718 may include eight symbols (e.g., m=8) per segment 704 and 706. With two r segments (e.g., r=2) and each outer code word including eight symbols per r segment 706, sixteen symbols of parity in each outer code word 718 can correct eight symbol errors (not correctable by the inner code) without erasure. Therefore, in the embodiment illustrated in FIG. 7, all of the outer code words 718 may be correctable since each outer code word 718 has at most eight symbol errors 720 as represented in cross-hatch. Although no symbol errors exist in segments 706, for purposes of simplification, it should be realized that segments 706 can also include symbol errors which may also have to be corrected in order to utilize outer code 712.

If, on the other hand, any of the outer code words 718 had more than eight symbol errors 720, then the outer code 712 illustrated in FIG. 7 may not be usable to recover all of the errors that could not be corrected by the inner code. Any outer code words 718 that include a number of symbol errors that exceeds the correction capability of the outer code may not be correctable and therefore may not be recoverable. However, in some embodiments, the capability of the outer code to correct inner code failures can be further extended. In particular, the capability of the outer code to correct more symbol errors can be extended by iterating between the inner and the outer codes. The corrected data from the outer code words that may be correctable may be usable to recover some of the inner code words that had originally failed. Correcting only a fraction of the bits in error at a time can be sufficient to gradually reduce the number of errors by repeated iterations until all the errors are corrected. In the other words, some of the outer code words may be corrected in the first iteration, compared to correcting all of the outer code words.

Figure 8:
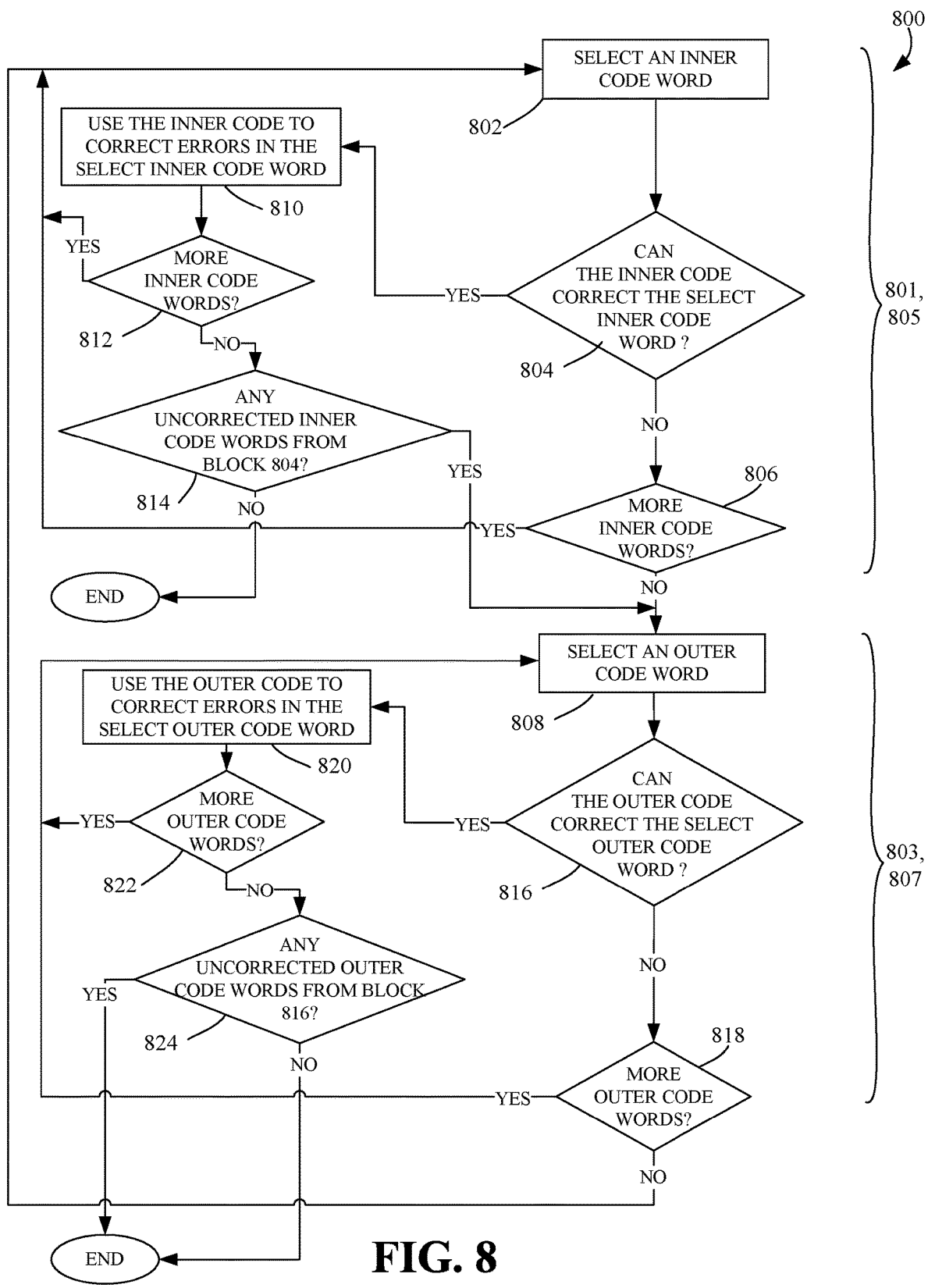
FIG. 8 is a flowchart illustrating a method of recovering data using inner and outer codes, in accordance with certain embodiments of the present disclosure.
Figure 9:
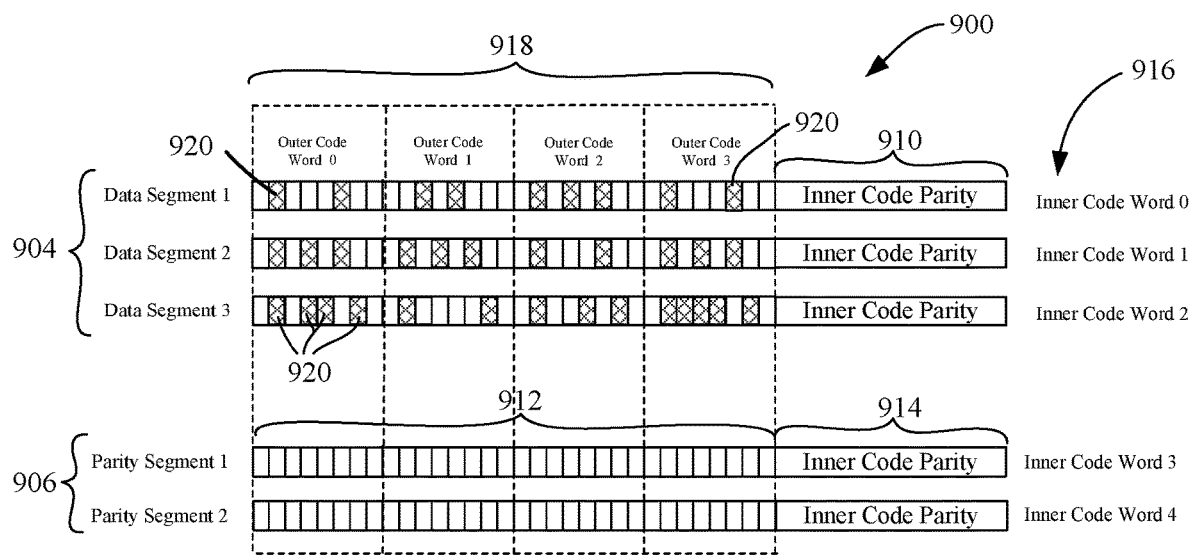
FIG. 9 illustrates a diagrammatic view of a data unit and its organized groupings of data into inner and outer codes based on a Reed-Solomon scheme, in accordance with certain embodiments of the present disclosure.

FIG. 8 illustrates a method 800 of recovering data on a storage medium under one embodiment. More specifically, method 800 recovers data on a storage medium by iterating between using the inner code and the outer code to correct errors (e.g. iterative outer code (IOC) recovery). With reference to FIG. 9, which illustrates a diagrammatic view of some embodiments of a data unit 900 and the organization of groups of data into inner code 910 and 914 and outer code 912 based on a RS scheme, each outer code word 918 can correct eight symbols of error. More specifically, each outer code word 918 may include eight symbols (e.g., m=8) per segment 904 and 906. With two r segments (e.g., r=2) and each outer code word including eight symbols per parity segment 906, sixteen symbols of parity in each outer code word 918 can correct eight symbol errors (which may not be correctable by the inner code) without erasure. Although no symbol errors may exist in segments 906, for purposes of simplification, it should be realized that parity segments 906 can include symbol errors which may also have to be corrected in order to utilize outer code 912.

Given the correction capability discussed above, exemplary data unit 900 may not recover all of the symbol errors using the inner code on its own or by using the outer code on its own. For example, the amount of symbol errors in each inner code word 916 may exceed the correction capability or correction reliability of inner code 910 and inner code recovery may be unable to recover these inner code words. Furthermore, outer code word 0 may include nine symbol errors 920 and outer code word 3 may include ten symbol errors 920. Therefore, the amount of symbol errors in these outer code words 918 may exceed the correction capability of outer code 912 and may be unable to recover these outer code words. However, the symbol errors in the exemplary embodiment illustrated in FIG. 9 may be corrected by iterating between using inner code 910 and outer code 912.

With reference back to block 802 of FIG. 8, an inner code word 916 may be selected. At block 804, it may be determined whether the inner code can correct the select inner code word. In FIG. 9, the inner code may fail to correct the symbol errors 920 in each of inner code words 0, 1 and 2. Therefore, when each of these three inner code words 916 are selected, the method may pass to block 806 to determine if more inner code words 916 need to be selected for analysis. If all inner code words 916 have been selected for analysis, then the method may pass to block 808. If, however, not all inner code words 916 have been selected for analysis, then the method may pass back to block 802. In the example embodiment of FIG. 9, such may be the case because inner code words 3 and 4 have yet to be analyzed. In FIG. 9, the inner code can correct errors in inner code words 3 and 4. Therefore, when each of these two inner codes words 916 is selected, the method may pass to block 810. At block 810, the inner code 910 or 914 (914 in the case of inner code words 3 and 4) may correct any errors in the select inner code word. While neither inner code word 3 nor 4 include symbol errors, if there were errors correctable by the inner code 914, these errors may be corrected at block 810.

At block 812, the method 800 may determine if more inner code words 916 remain to be selected for analysis. If all inner code words have been selected for analysis, then the method 800 may pass to block 814. If inner code words remain to be selected for analysis, the method may pass back to block 802. At block 814, it may be determined whether there are any uncorrected inner code words 916 from block 804. If so, method 800 may pass to block 808. If not, the method may end. As illustrated in FIG. 8, the above discussion in regards to blocks 802, 804, 806, 810, 812 and 814 may complete a first iteration 801 of the use of inner code to correct symbol errors in a data unit.

In conjunction with the example embodiment illustration in FIG. 9, inner code words 0, 1 and 2 may remain uncorrected. Therefore, method 800 may pass to block 808 where an outer code word 918 may be selected. At block 816, it may be determined whether the outer code can correct the select outer code word. In FIG. 9, the symbol errors 920 in each of outer code words 0 and 3 may exceed the correction capability of outer code 912 (e.g., each of outer code words 0 and 3 include more than eight symbol errors). Therefore, when each of these two outer code words 918 are selected, the method may pass to block 818 to determine if more outer code words 918 need to be selected for analysis. If all outer code words 918 have been selected for analysis, then the method may pass back to block 802. If, however, not all outer code words 918 have been selected for analysis, then the method may pass back to block 808. In the example embodiment of FIG. 9, such may be the case because outer code words 1 and 2 have yet to be analyzed. In FIG. 9, the amount of symbol errors in outer code words 1 and 2 may not exceed the correction capability of the outer code. In particular and as previously discussed, outer code words 1 and 2 may include 7 and 8 symbol errors. Therefore, when each of these two outer codes words 918 are selected for analysis, the method may pass to block 820. At block 820, the outer code 912 can correct the symbol errors in outer code words 1 and 2.

At block 822, the method 800 determines if more outer code words 918 may remain to be selected for analysis. If all outer code words have been selected for analysis, then the method 800 may pass to block 824. If outer code words remain for analysis, the method may pass back to block 808 which may select those outer code words for analysis. At block 824, it may be determined whether there were any uncorrected outer code words 918 as determined from block 816. If so, method 800 may pass back to block 802 which may perform a second iteration 805 of error correction using the inner code. If not, the method may end. An indication that all outer code words 918 are corrected may also be an indication that all inner code words 916 are corrected. As illustrated in FIG. 8, the above discussion in regards to blocks 808, 816, 818, 820, 822 and 824 complete a first iteration 803 of the use of outer code to correct symbol errors in a data unit.

Figure 10:
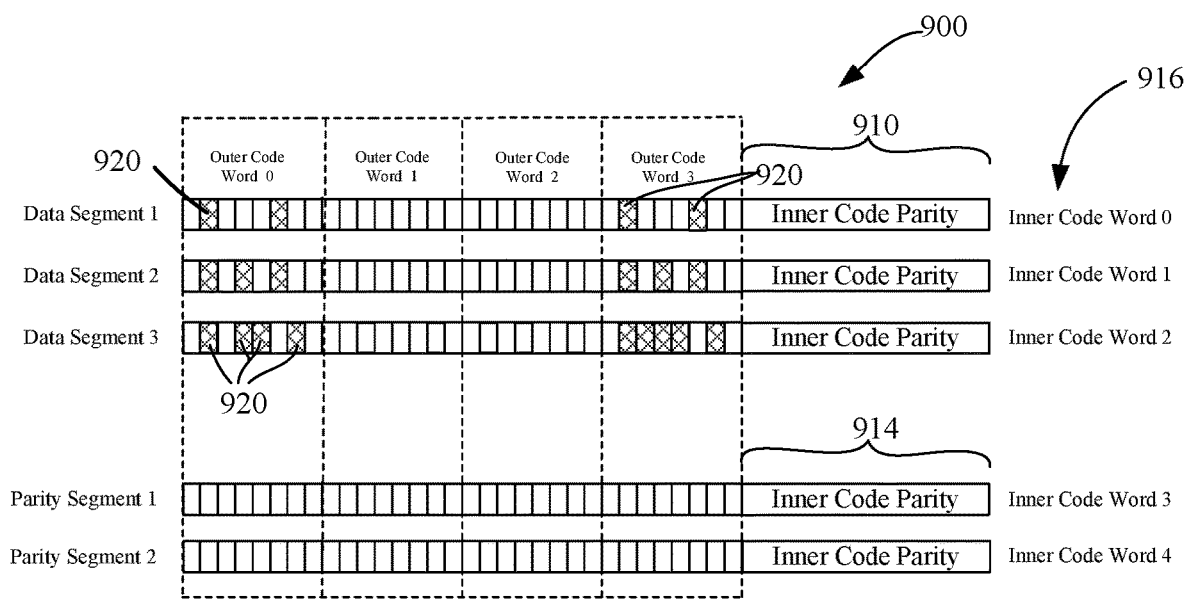
FIG. 10 illustrates a diagrammatic view of the data unit illustrated in FIG. 9 after data is recovered using a first iteration of inner code and a first iteration of outer code, in accordance with certain embodiments of the present disclosure.

FIG. 10 illustrates a diagrammatic view of data unit 900 and the organization of groups of data after performing the first iteration 801 of inner code and the first iteration of 803 on the data unit. In FIG. 10, outer code words 1 and 2 may be corrected, which may leave outer codes 0 and 3 uncorrected.

With more outer code word symbol errors to correct, method 800 may be passed back to block 802 to begin performing a second iteration 805 of inner code. At block 802, an inner code word 916 may be selected. At block 804, it is determined whether the inner code can correct the select inner code word. In FIG. 10, only the symbol errors 920 may not be corrected by inner code 910. Therefore, when inner code words 2 is selected, the method may pass to block 806 to determine if more inner code words 916 remain to be selected for analysis. If all inner code words 916 have been selected for analysis, then the method may pass to block 808. If, however, not all inner code words 916 have been selected for analysis, then the method may pass back to block 802. In the example embodiment illustrated in FIG. 10, such may be the case because inner code words 0, 1, 3 and 4 may yet to be analyzed. In FIG. 10, the symbol errors in inner code words 0, 1, 3 and 4 may be corrected by the inner code. Therefore, when each of these four inner codes words 916 may be selected, the method may pass to block 810. At block 810, the inner code 910 or 914 (910 in the case of inner code words 0 and 1 and 914 in the case of inner code words 3 and 4) may correct errors in the select inner code word. While neither inner code word 3 nor 4 may include symbol errors, if there were errors correctable by the inner code 914, these errors may be corrected at block 810.

At block 812, the method 800 may determine if more inner code words 916 remain to be selected for analysis. If all inner code words have been selected for analysis, then the method 800 may pass to block 814. If not all inner code words have been selected for analysis, the method may pass back to block 802. At block 814, it may be determined whether there are any uncorrected inner code words 916 from block 804. If so, method 800 may pass to block 808. If not, the method may end.

Figure 11:
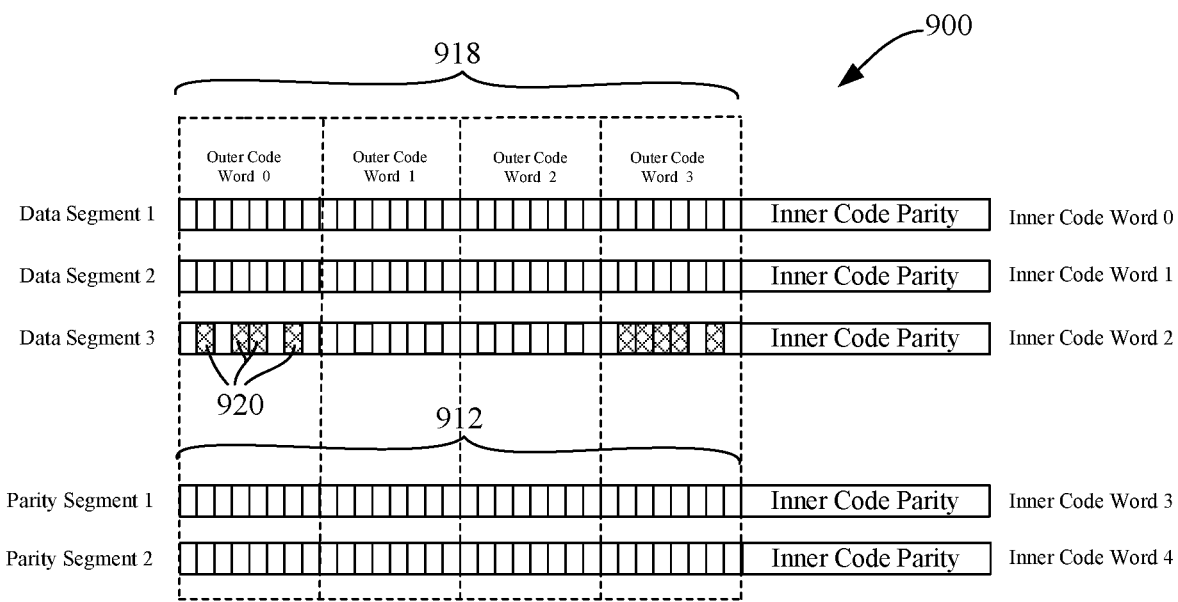
FIG. 11 illustrates a diagrammatic view of the data unit illustrated in FIG. 9 after data is recovered using a second iteration of inner code, in accordance with certain embodiments of the present disclosure.

In conjunction with the example illustration in FIG. 11, inner code word 2 may remain uncorrected. Therefore, method 800 may pass to block 808 to perform a second iteration 807 of the use of outer code to correct symbol errors in a data unit. At block 808, an outer code word 918 may be selected. At block 816, it may be determined whether the outer code may correct the select outer code word. In FIG. 11, if any of outer code words 918 exceed the correction capability of outer code 912 (e.g., each of outer code words 918 include more than eight symbol errors), then the method may pass to block 818 to determine if more outer code words 918 remain to be selected for analysis. If all outer code words 918 have been selected for analysis, then the method may pass back to block 802. If, however, not all outer code words 918 have been selected for analysis, then the method may pass back to block 808. In FIG. 9, the amount of symbol errors in outer code words 0, 1, 2 and 3 may not exceed the correction capability of the outer code. In particular, outer code word 0 includes four symbol errors, outer code word 1 includes no symbol errors, outer code word 2 includes no symbol errors and outer code word 3 includes only five symbol errors. Therefore, when these outer codes words 918 are selected for analysis, the method may pass to block 820. At block 820, the outer code 912 may correct the symbol errors in all outer code words.

Figure 12:
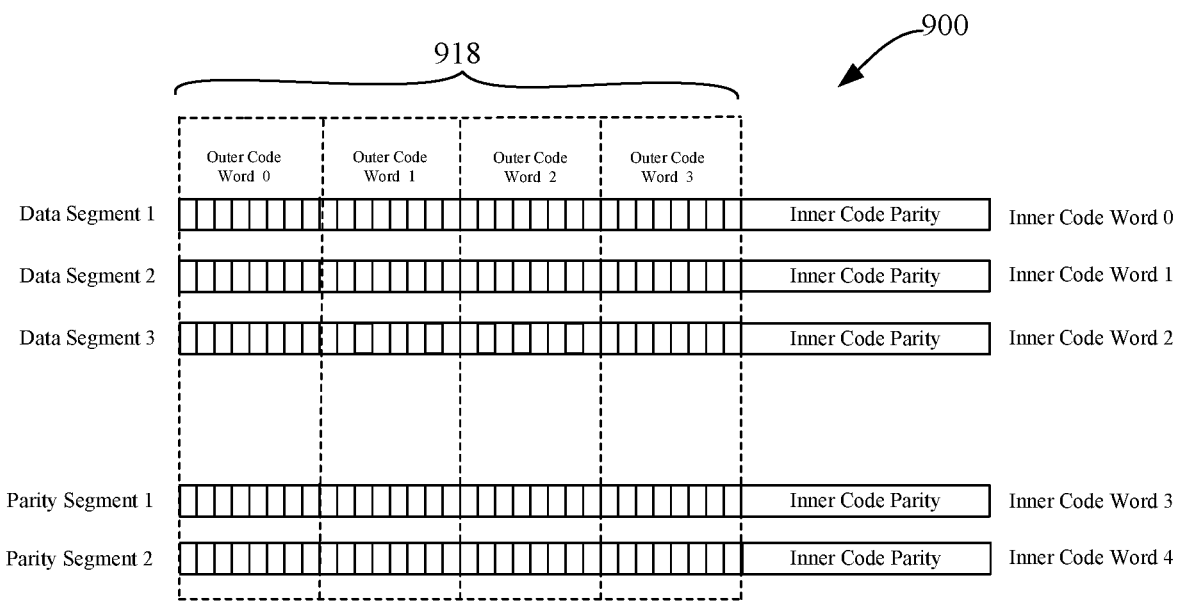
FIG. 12 illustrates a diagrammatic view of the data unit illustrated in FIG. 9 after data is recovered using a second iteration of outer code, in accordance with certain embodiments of the present disclosure.

At block 822, the method 800 may determine if more outer code words 918 need to be selected for analysis. If all outer code words have been selected for analysis, then the method 800 may pass to block 824. If not all outer code words have been selected for analysis, the method may pass back to block 808 to select those outer code words. At block 824, it may be determined whether there were any uncorrected outer code words 918 as determined from block 816. If so, method 800 may pass back to block 802 to perform a third iteration of error correction using the inner code. If not, the method may end. As illustrated in FIG. 12, the outer code words 918 of data unit 900 may have been corrected using first and second iterations of inner and outer code and therefore method 800 may end.

As mentioned above, the example systems and methods herein may also utilize erasure recovery. Erasure recovery may include a segment-wise implementation of outer code recovery (as opposed to the symbol-wise outer code recovery discussed above). For example, the outer code of a data unit may have an erasure capability (E) which may be the number of errors the outer code is able to correct. In some embodiments, the erasure capability may be the number of parity data segments included in the data unit. In erasure recovery, the system may determine if the number of data segments which have failed (failed to decode or which have been deferred) is less than the erasure capability of the outer code. If the number of failed data segments is within the erasure capability of the outer code, the failed data segment may be recovered from the recovered data segments with or without the utilization of the outer code symbols of the failed data segments which were recovered. For example, the failed data segments may be discarded and recovered using outer code recovery based on the successfully recovered segments.

Further, as mentioned above, the example systems and methods herein may also utilize deferred decoding to recover failed sectors. Deferred decoding may be used when the portions of failed data (e.g. data segments) are buffered after the initial decoding of the data segment fail. For example, failed data segments may be stored in a buffer and may be decoded, or reprocessed, for example, using variable-length decoding, e.g., under more relaxed time constraints (which may, e.g., be referred to as deferred decoding). Variable-length decoding may include iterative decoding. Such iterative decoding may not decode the failed data segment after a predetermined number (e.g., one, two, five, ten, etc.) of iterations of decoding and may require additional iterations of decoding. In other words, some data portions may be harder to recover or decode using iterative decoding, and therefore, may take a longer amount of time for convergence of the iterative decoding algorithm to, e.g., fix the errors in the failed data portion. As such, if iterative decoding failed initially, the data segment may be buffered for deferred decoding which may include additional iterations the iterative decoding process.

Example systems and methods described herein may use dynamic, side information related to one or more failed data segments (e.g., failed segments of data) and the state of the read (e.g. an OC syndrome or a count of failed sectors). One example piece of side information may be a decoding-success score for each data segment of the plurality of data segments in each of the plurality of data units. The decoding-success score for a data segment may represent, or estimate, the amount of errors within the data segment. In at least one embodiment, the decoding-success score may represent the signal-to-noise ratio for the data segment. The decoding-success score may be used to determine whether a particular failed data segment may be decoded using deferred decoding. For example, a higher decoding-success score may represent a lower amount of errors and a higher likelihood of successful decoding using deferred decoding, and a lower decoding-success score may represent a higher amount of errors and a lower likelihood of successful decoding using deferred decoding. Further, for example, a higher decoding-success score may represent a shorter amount of time deferred decoding may take to decode the failed data segment, and a lower decoding-success score may represent a longer amount of time deferred decoding may take to decode the failed data segment.

In at least one embodiment, the decoding-success score for each data segment can be obtained from a detector (e.g., Viterbi detector, Bahl, Cocke, Jelinek and Raviv (BCJR) decoder, Soft output Viterbi algorithm (SOVA), etc.). For example, soft output detector values (LLRs) can be used to estimate the decoding-success score. In at least one embodiment, the decoding-success score can be estimated by reconstructing an ideal waveform using detector decisions and then estimating a signal-to-noise ratio by subtracting the received waveform from the ideal waveform. In at least one embodiment, the decoding-success score may be estimated by the residual mean squared error from an equalizer. In at least one embodiment, the decoding-success score can also be modified based on how many (e.g., an amount) iterative decoding iterations have been performed on the segment previously. If less iterations were performed (e.g., due to limited availability of the decoder), then the decoding-success score for that portion could be incrementally increased.

In some embodiments, the above described recovery processes may be utilized in various combinations. In some example embodiments, the recovery processes may be utilized opportunistically. An example embodiment that may utilize the recovery methods opportunistically is shown and described with respect to FIG. 13 below.

Figure 13:
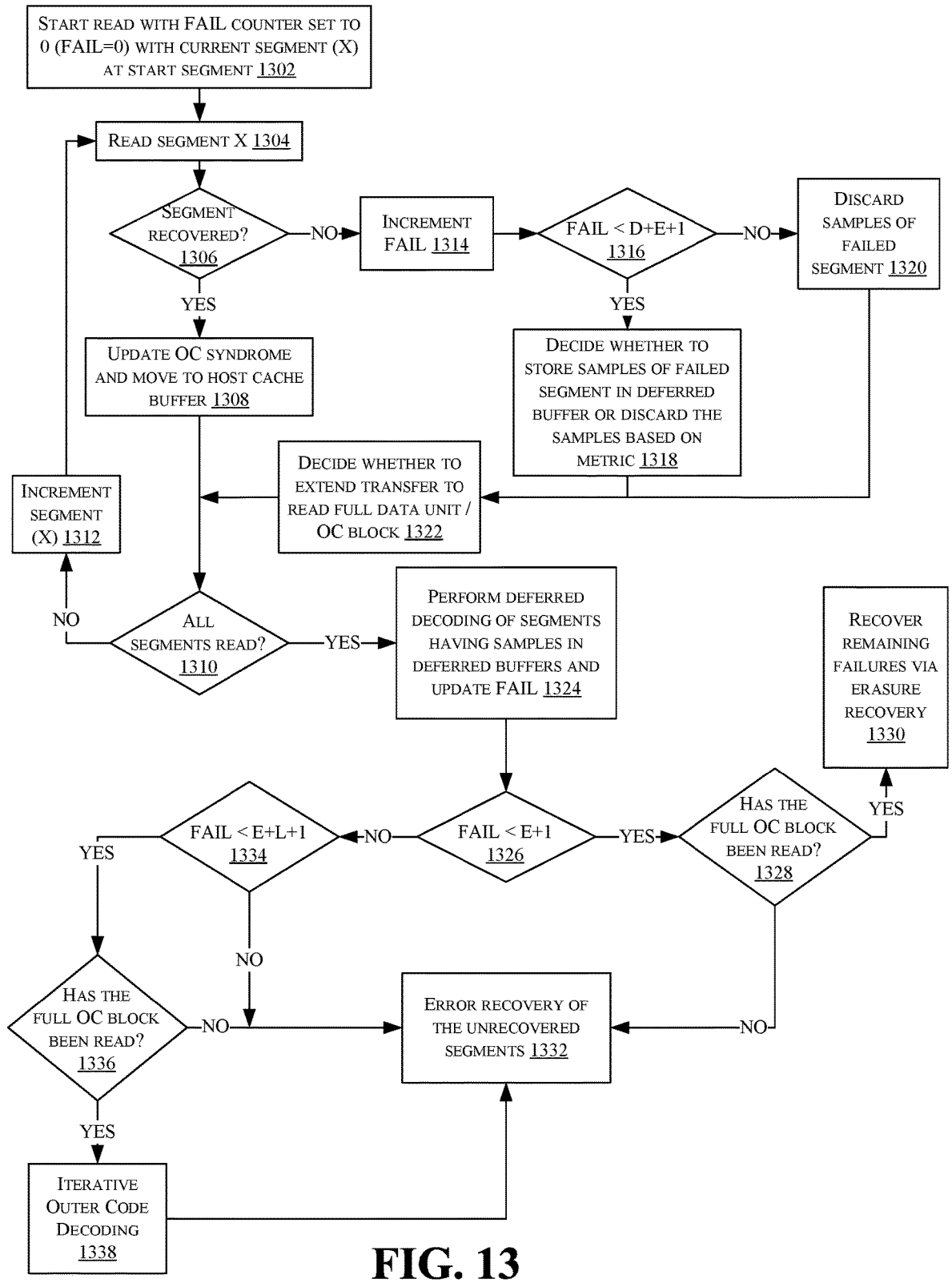
FIG. 13 is a flowchart illustrating a method of recovering data by utilizing the recovery methods opportunistically, in accordance with certain embodiments of the present disclosure.

FIG. 13 illustrates a method 800 of recovering data on a storage medium under some embodiment. More specifically, method 800 recovers data on a storage medium by utilizing the above discussed recovery methods opportunistically. The method 1300 can be an embodiment of, or performed by, the system 100 in some examples.

At 1302, the system may start a read. When the read is started, a fail counter is set to zero and the current segment is set to at the start segment of the read. In some examples, the read may be requested by a host. At 1304, the current segment (X) is read and an initial decoding is performed. For example, the initial decoding may include a number of iterations of an inner decoder iterative decoding algorithm. At 1306, the system may determine whether the segment was recovered. For example, the system may determine whether the segment was recovered using an inner code parity check decoder. If the segment was recovered, the process continues 1308. Otherwise, the process continues 1314.

At 1308, the outer code syndrome is updated and the recovered segment is moved to a cache buffer. The process then continues to 1310.

At 1310, a determination is made whether all data segments in the current scope of the read operation have been read. As will be discussed in more detail below with regard to 1320, the scope of the read operation may be extended, for example, to include the entire data unit or outer code block. As such, the determination at 1310 may be performed with regard to the current scope of the read operation, not the initial scope. If the data segments in the scope of the read operation have been read, the process may continue to 1324. Otherwise the process may continue to 1312. At 1312, the current segment (X) is incremented and the process may return to 1304.

As stated above, if the segment is determined to not be recovered at 1306, the process may continue to 1314. At 1314, the fail counter may be incremented and the process may continue to 1316. At 1316, a determination may be made whether the fail counter is less than or equal to the sum of the number of deferred buffers (D) and the erasure capability of the outer code (E) (e.g. less than D+E+1). If so, the process may continue to 1318. Otherwise the process may continue to 1320.

At 1318, a determination may be made whether to store samples of the failed segment in a deferred buffer. The determination at 1318 may include, if the deferred buffer is full, whether to discard currently buffered samples corresponding to another failed segment (hereinafter, buffered segment) in favor of samples of the current failed segment. As such, the determination of 1318 may first determine whether the deferred buffer is full. In some embodiments, if the deferred buffer is not full, the samples of the current failed segment may always be stored. In other embodiments, if the deferred buffer is not full, the determination of 1318 may evaluate side information related to the current failed segment to determine whether or not to buffer the samples of the current failed segment. For example, the determination 1318 may evaluate the decoding-success score of the current failed segment. If the buffer is full, the determination of 1318 may compare the side information of the current failed segment to side information of buffered segments (e.g. compare decoding-success scores). Based on the comparison, samples of one of the current failed segment or a buffered segment may be discarded. The process then continues to 1322.

Returning to 1320, because the number of failed segments is greater than the sum of the number of deferred buffers (D) and the erasure capability of the outer code (E), the samples of the current failed segment may be discarded without consideration of buffering. The process then continues to 1322.

At 1322, a determination may be made whether to extend the read operation to read the full data/unit or outer code block. In some embodiments, the determination may extend the read once the number of failed segments exceeds the number of deferred buffers (D). However, implementations are not so limited and, in determining to extend the read operation beyond its initial scope, some embodiments may consider other factor such as the decoding-success score of the buffered segments. The process then continues to 1310.

As stated above, at 1310, if the segments in the current scope of the read operation have been read, the process may continue to 1324. At 1324, the system may perform deferred decoding of failed segments whose samples have been stored in the buffer. The fail counter may be updated (e.g. decremented) to account for failed segments that are successfully recovered. The process may then continue the 1326.

At 1326, a determination may be made whether the fail counter is less than or equal to the erasure capability of the outer code. If so, the process may continue 1328. Otherwise, the process may continue 1334.

At 1328, a determination may be made whether the full outer code block has been read. If so, the process continues to 1330. Otherwise, the process may continue to 1332. At 1330, the system may perform erasure recovery. The process may then end.

As stated above, if 1328 determines the full outer code block has not been read, the process may continue to 1332. At 1332, the system may perform error recovery for the unrecovered segments (e.g. failed segments). The error recovery performed at 1332 may include various types of recovery. For example, the system may perform an extended read of the unrecovered sectors and utilize various techniques with regard to additional samples for those sectors. Other error recovery techniques that may be employed are adjacent track interference cancellation and averaging of multiple samplings (e.g. reads) of the segment. In some embodiments, the other error recovery methods may be employed only on the failing sectors to reduce the number of failed segments to a smaller number where, for example, IOC or erasure recovery may be invoked.

As stated above, if 1326 determines the fail counter is greater than the erasure capability of the outer code, the process may continue to 1334. At 1334, the system may determine whether the fail counter is less than or equal to the sum of the erasure capability of the outer code and a threshold. In some embodiments, the threshold may be fixed, adjustable, determined on the fly etc. For example, the threshold may be determined on the fly using knowledge of severity of the segment failures and the number of parity segments available in the OC block. In addition, the threshold may be determined based on a number of hardware buffers available and a latency to recover some number of sectors. If the fail counter is less than or equal to the sum of the erasure capability of the outer code and the threshold, the process may continue to 1336. Otherwise, the process may continue to 1332 described above.

At 1336, a determination may be made whether the full outer code block has been read. If so, process may continue to 1338. Otherwise, the process may continue to 1332 described above.

At 1338, iterative outer code (IOC) recovery may be performed, for example, in the manner described above. The process may then continue to 1332 as described above.

Many variations would be apparent in view of this disclosure. For example, in some implementations, blocks 1316 and 1320 may not be included and the determination at 1322 of whether to buffer or discard the current failed segment may be performed after the number of failed segments exceeds the sum of the number of deferred buffers (D) and the erasure capability of the outer code (E). Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a circuit configured to:
   initialize a read operation to read multiple data segments of a respective data unit having a plurality of data segments;

perform an inner decoder iterative decoding to recover data from a first data segment of the multiple data segments;
determine if the first data segment has been recovered;
when the first data segment has not been recovered, increment a fail counter;
determine if a value of the fail counter is less than or equal to a threshold representing a sum of an erasure capability of an outer code error recovery and a number of hardware buffers available to store failed sample segments in a deferred decoding buffer;
when the value of the fail counter is less than or equal to the threshold, store a sample of a respective failed segment in the deferred decoding buffer;
when the value of the fail counter is greater than the threshold, discard the sample of the respective failed segment;
once all segments of the plurality of data segments have had recovery attempted by the above process, perform deferred decoding of the failed sample segments stored in the deferred decoding buffer, the deferred decoding including variable-length decoding;
decrement the value of the fail counter for each segment stored in the deferred decoding buffer that is successfully decoded via the deferred decoding;
determine whether the fail counter is less than or equal to the erasure capability of the outer code recovery;
when the value of the fail counter is less than the erasure capability, attempt to recover any remaining failed segments via erasure recovery including a segment-wise implementation of outer code recovery; and
when the value of the fail counter is greater than the erasure capability, perform iterative outer code recovery via a symbol-wise implementation of outer code recovery to recover the failed data segments.

2. The apparatus of claim 1, further comprising:
the read operation being initialized to read a first number of data segments that is less than a second number of data segments included in an outer code block of the respective data unit; and
the circuit further configured to:
determine, at least in part based on the number of failed data segments, to extend the read operation to include more than the first number of data segments of the outer code block.

3. The apparatus of claim 1, further comprising:
a buffer; and
the circuit further configured to:
determine whether to store first samples of a first failed data segment in the buffer based on side information for the first failed data segment and side information for at least one second failed data segment corresponding to respective second samples stored in the buffer.

4. The apparatus of claim 3, further comprising the side information including a data-success score representing one of a signal-to-noise ratio for the respective data segment and a residual mean squared error from an equalizer.

5. The apparatus of claim 1, further comprising the circuit further configured to perform the symbol-wise implementation of outer code recovery at least in part by:
performing a first iteration of inner code error correction on a plurality of symbol-based inner code words;
performing a first iteration of outer code error correction on a plurality of symbol-based outer code words, wherein each symbol included in one of the inner code words is also included in one of the outer code words and wherein at least one of the outer code words is correctable; and
performing a second iteration of inner code error correction on the plurality of symbol-based inner code words.

6. The apparatus of claim 1, further comprising the circuit configured to perform error recovery for any failed segments that still are not recovered after the symbol-wise implementation of outer code recovery.

7. The apparatus of claim 6, further comprising the error recovery includes an extended read of the unrecovered sectors.

8. The apparatus of claim 6, further comprising the error recovery includes adjacent track interference cancellation.

9. The apparatus of claim 6, further comprising the error recovery includes averaging of multiple samplings of a failed segment.

10. The apparatus of claim 6, further comprising the error recovery may be employed only on failing sectors to reduce a number of failed segments.

11. A method of recovering data comprising:
receiving one or more data segments of a respective data unit having a plurality of data segments;
performing inner code iterative decoding to recover data from the data segments and increment a fail counter for each failed segment;
for each failed segment, determining if a value of the fail counter is less than a threshold representing a sum of an erasure capability of an outer code error recovery and a number of hardware buffers available to store failed segments in a buffer;
when the value of the fail counter is less than the threshold, storing a sample of a respective failed segment in the buffer;
when the value of the fail counter is greater than the threshold, discarding the sample of the respective failed segment;
performing deferred decoding of the failed segments stored in the buffer and decrement the value of the fail counter for each segment stored in the buffer that is successfully decoded via the deferred decoding, the deferred decoding including variable-length decoding and occurring before erasure recovery and iterative outer code recovery are attempted;
determining whether the fail counter is less than the erasure capability of the outer code error correction scheme;
when the value of the fail counter is less than the erasure capability, performing erasure recovery to recover the failed data segments; and
when the value of the fail counter is greater than the erasure capability, performing iterative outer code recovery to recover the failed data segments.

12. The method of claim 11, further comprising:
receiving the one or more data segments includes performing a read operation on a data storage medium, the read operation being initialized to read a first number of data segments that is less than a second number of data segments included in an outer code block of the respective data unit; and
determining, at least in part based on a number of failed data segments, to extend the read operation to include each segment of the outer code block.

13. The method of claim 11, further comprising:
determining whether to store first samples of a first failed data segment in the buffer based on side information for the first failed data segment, the side information including a decoding-success score that represents an amount of errors within a respective segment; and updating a counter of failed data segments in response to the deferred decoding recovering one or more of the failed data segments.

14. A device comprising:

a buffer circuit;

a data channel circuit configured to:

initialize a read operation to read one or more requested data segments of a respective data unit having a plurality of data segments;

perform inner code iterative decoding to recover data from the data segments, and and increment a fail counter for each failed segment;

for each failed segment, determine if a value of the fail counter is less than a threshold representing a sum of an erasure capability of an outer code error recovery and a number of hardware buffers available to store failed segments in a buffer;

when the value of the fail counter is less than the threshold, store a sample of a respective failed segment in the buffer;

when the value of the fail counter is greater than the threshold, discard the sample of the respective failed segment;

perform deferred decoding of the failed segments stored in the buffer and decrement the value of the fail counter for each segment stored in the buffer that is successfully decoded via the deferred decoding, the deferred decoding including variable-length decoding;

determine whether the fail counter is less than the erasure capability of the outer code error correction scheme;

when the value of the fail counter is less than the erasure capability, perform erasure recovery to recover the failed data segments still in the buffer; and when the value of the fail counter is greater than the erasure capability, perform iterative outer code recovery to recover the failed data segments still stored in the buffer.

15. The device of claim 14, further comprising the erasure capability is the number of parity data segments available and the erasure recovery includes performing Reed-Solomon error correction on a per data segment basis utilizing the parity data segments.

16. The device of claim 14, further comprising the data channel circuit configured to determine whether to store a first sample of a first failed data segment in the buffer based on side information for the first failed data segment, the side information including a decoding-success score for each data segment which represents an estimate of a number of errors in the data segment.

17. The device of claim 16, further comprising the data channel circuit configured to, if the buffer is full, compare the side information of the first failed segment to side information of previous buffered segments and discard either the first sample or a sample previously stored in the buffer based on the comparison.

18. The device of claim 14, further comprising the buffer and the data channel circuit are part of a system-on-chip (SoC) circuit that includes a processor.

* * * * *

UNITED STATES PATENT AND TRADEMARK OFFICE
CERTIFICATE OF CORRECTION

PATENT NO. : 11,042,439 B1
APPLICATION NO. : 15/345440
DATED : June 22, 2021
INVENTOR(S) : Deepak Sridhara, Ara Patapoutian and Prafulla B Reddy Page 1 of 1

It is certified that error appears in the above-identified patent and that said Letters Patent is hereby corrected as shown below:

In the Claims

Column 17, Claim 14, Line 14, replace "and and" with --and--

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*